United States Patent [19]

Hermann et al.

[11] Patent Number: 5,274,297
[45] Date of Patent: Dec. 28, 1993

[54] QUARTZ RESONATOR VIBRATING IN A FUNDAMENTAL TORSION MODE

[75] Inventors: Jean W. Hermann, Neuchâtel; Claude Bourgeois, Bôle, both of Switzerland

[73] Assignee: Centre Suisse d'Electronique et de Microtechnique SA, Switzerland

[21] Appl. No.: 894,344

[22] Filed: Jun. 4, 1992

[30] Foreign Application Priority Data

Jun. 4, 1991 [CH] Switzerland ............... 01654/91

[51] Int. Cl.$^5$ .................................................. H01L 41/08
[52] U.S. Cl. ................................... 310/361; 310/346; 310/365; 310/367
[58] Field of Search ................ 310/361, 346, 365, 367

[56] References Cited

U.S. PATENT DOCUMENTS

| | | | |
|---|---|---|---|
| 4,313,071 | 1/1982 | Hermann et al. | 310/361 |
| 4,320,320 | 3/1982 | Momosaki et al. | 310/361 |
| 4,453,105 | 6/1984 | Kogure | 310/361 |
| 4,503,353 | 3/1985 | Hermann | 310/361 |
| 4,633,124 | 12/1986 | Kawashima | 310/361 |
| 5,059,853 | 10/1991 | Kawashima | 310/367 |

Primary Examiner—Mark O. Budd
Attorney, Agent, or Firm—Parkhurst, Wendel & Rossi

[57] ABSTRACT

A thin quartz plate having opposite major surfaces, each of the opposite major surfaces having a geometrical shape symmetrical or antisymmetrical with respect to an axis of reference; and X, Y and Z crystallographic directions corresponding to electrical, mechanical and optical axes, respectively, of the quartz plate, wherein the axis of reference forms an angle $\psi$ with said X axis, and the major surfaces form an angle $\theta$ with a plane defined by said X and Y axes, the angles $\theta$ and $\psi$ being chosen such that the first order frequency-temperature coefficient ($\alpha$) of the quartz resonator is substantially 0, and the second order frequency-temperature coefficient ($\beta$) of said quartz resonator is substantially 0. The shape of the resonator may be rectangular, square, polygonal, circular or elliptical. The resonator is fixed on a supporting base by means of at least one pair of connecting arms located on the extension of a nodal line. The resonator of the invention finds application in the field of relatively low frequency miniature resonators suitable for encapsulation.

14 Claims, 4 Drawing Sheets

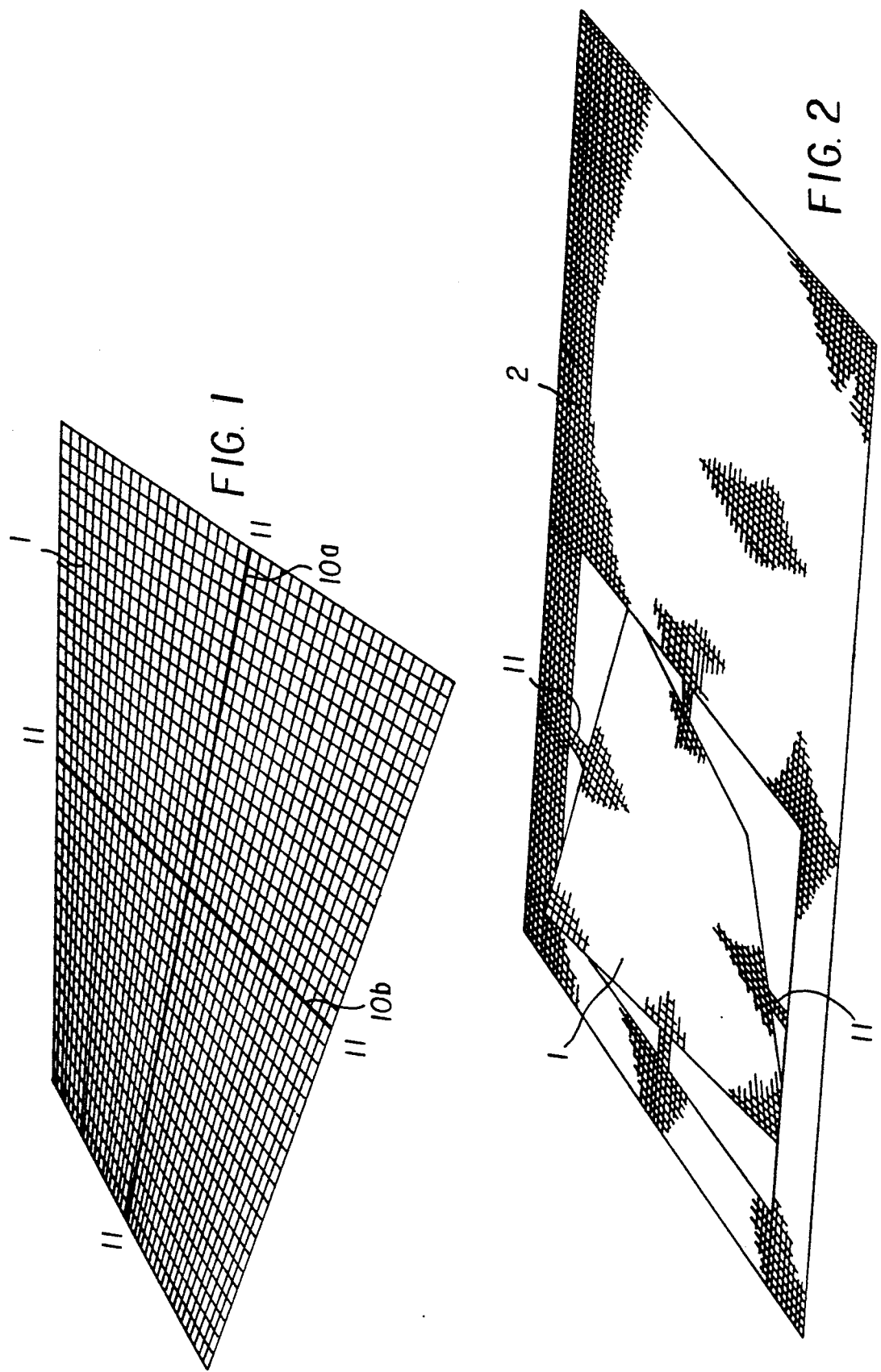

QUARTZ RESONATOR VIBRATING IN A FUNDAMENTAL TORSION MODE

BACKGROUND OF THE INVENTION

1. Field of the Invention

The present invention relates to quartz resonators and more particularly to resonators having good thermal properties, having a relatively low resonance frequency, vibrating in a fundamental torsion mode and being adapted to be mass-produced by chemical etching techniques.

2. Description of the Related Art

Resonators are known which meet the conditions of having small variation in frequency as a function of temperature, having a low resonance frequency and being chemically machined. Examples can be found in the following references:

(1) "New quartz tuning fork with very low temperature coefficient" B. Momosaki et al., appearing in the 33rd Annual Symposium on Frequency Control (A.S.F.C.), 1979, pp. 247-254.

(2) "Vibration analysis of coupled flexural mode tuning fork type quartz crystal resonator" by H. Kawashimi, appearing in the 42nd A.S.F.C. 1988, pp. 45-52.

(3) "A new low frequency thermally compensated contour mode resonator" by C. Bourgeois, appearing in the 44th A.S.F.C., 1990, pp. 367-371.

The three references above relate to resonators using coupling between two modes of vibration in order to improve the thermal properties. The first two references concern a tuning fork resonator vibrating in a flexural mode coupled to a torsion mode, while the third reference concerns a resonator vibrating in an elongation mode coupled to a flexural mode. The device of the three references described above are characterized by the use of relatively close coupling between the modes of vibration. By close coupling there is understood a relatively small frequency difference (<2%) between the non-coupled modes. A result of this close coupling is that the resulting thermal properties depend critically on certain geometrical dimensions; this considerably reduces the yield in the manufacture of such resonators and restricts practical interest.

SUMMARY OF THE INVENTION

Accordingly, one object of the invention is a quartz resonator having good thermal properties, being adapted to be mass-produced and not having the disadvantages of the examples of the prior art described above.

Another object of the invention is a quartz resonator whose thermal properties do not depend critically on its geometrical dimensions.

Another object of the invention is a quartz resonator suitable for encapsulation.

The type of vibration selected according to the present invention does not rely on mode coupling so that the variation in the frequency of the resonator as a function of temperature depends neither on the ratio of dimensions of the base rectangle, nor on its thickness. The use of vibration out of the plane of the resonator results in a relatively low frequency of vibration, for example of the order of 0.5 MHz for a miniature resonator capable of being fitted in a cylindrical encapsulation of 2 mm external diameter.

BRIEF DESCRIPTION OF THE DRAWINGS

Other objects, features and advantages of the present invention will appear from a reading of the following description of particular embodiments, these examples being given purely by way of illustration and with reference to the accompanying drawings, in which:

FIG. 1 shows an example of a resonator in accordance with the invention, being rectangular and having nodal lines, extensions from which can be used to fix the resonator;

FIG. 2 shows the resonator of FIG. 1 provided with a support frame;

FIG. 7b is a section of the diagram of FIG. 7a;

DETAILED DESCRIPTION OF THE PREFERRED EMBODIMENTS

In a preferred embodiment of the invention, the resonator is a thin plate 1 of square or rectangular shape. FIG. 1 shows the nodal lines 10a and 10b (loci of points with no movement), having one or more fixing arms 11 extending therefrom. It would be equally possible to fix the resonator by means of a support wire soldered to the point of intersection of the nodal lines. However, the method of fixing of greatest interest is illustrated in FIG. 2, showing the resonator 1 of FIG. 1 fixed to a frame 2 by four arms 11 located in the extensions of the nodal lines. Another possible solution would consist of only providing two fixing arms, located at the opposite ends of the same modal line. Since frame 2 is preferably also made of quartz, it is possible to make the resonator, the arms and the frame simultaneously.

Figure 3:
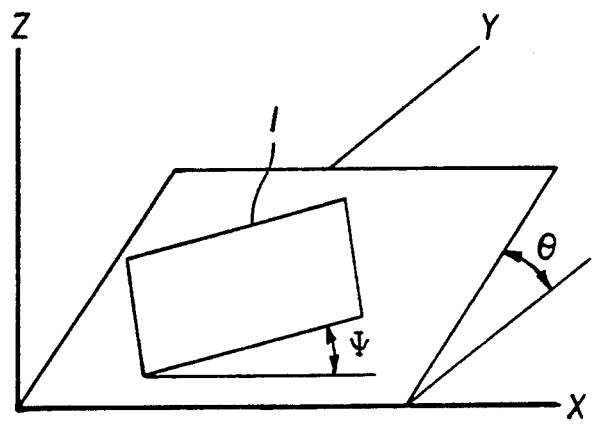
FIG. 3 shows the angles of cut of a first form of resonator in accordance with the invention.
Figure 4:
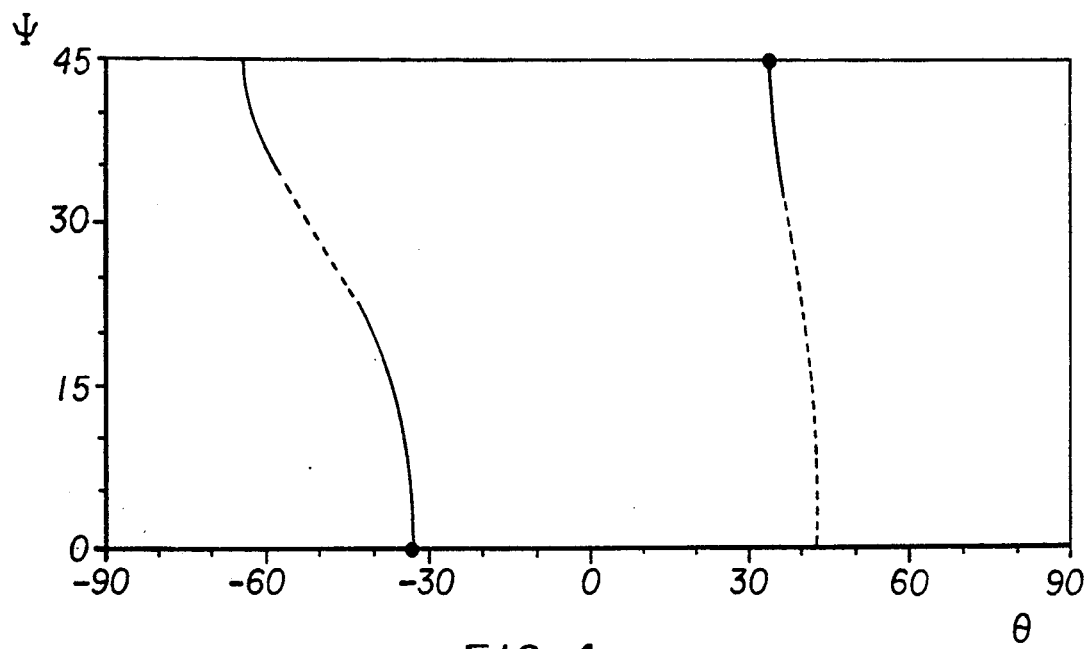
FIG. 4 shows the loci corresponding to zero values of the first order frequency-temperature coefficient, for the embodiment of FIG. 3.

FIG. 3 shows the lines of cut of a first embodiment of a resonator in accordance with the invention. The axes X, Y and Z of the coordinate system correspond respectively to the electrical, mechanical and optical axes of the quartz crystal. The resonator 1 is obtained by cutting one edge thereof (parallel to the longitudinal axis of symmetry) at an angle $\theta$ with respect to the X axis, followed by the major faces thereof being cut at an angle $\psi$ with respect to the normal. The graph of FIG. 4 represents the loci of the zero values of the frequency-temperature coefficient of the first order, or the coefficient $\alpha$, which define the possible values of the angles of cut $\theta$ and $\psi$ for which the resonator exhibits good thermal properties, namely a zero frequency-temperature coefficient of first order $\alpha$ and a frequency-temperature coefficient of second order, or coefficient $\beta$, which si zero or has a very small value. The loci $\alpha = 0$ are shown in full lines in the regions where the coefficient of second order $\beta$ is very small, that is to say less than a value of $10.10^{-9}/°C^2$, and in dotted lines in the other regions.

Figure 5:
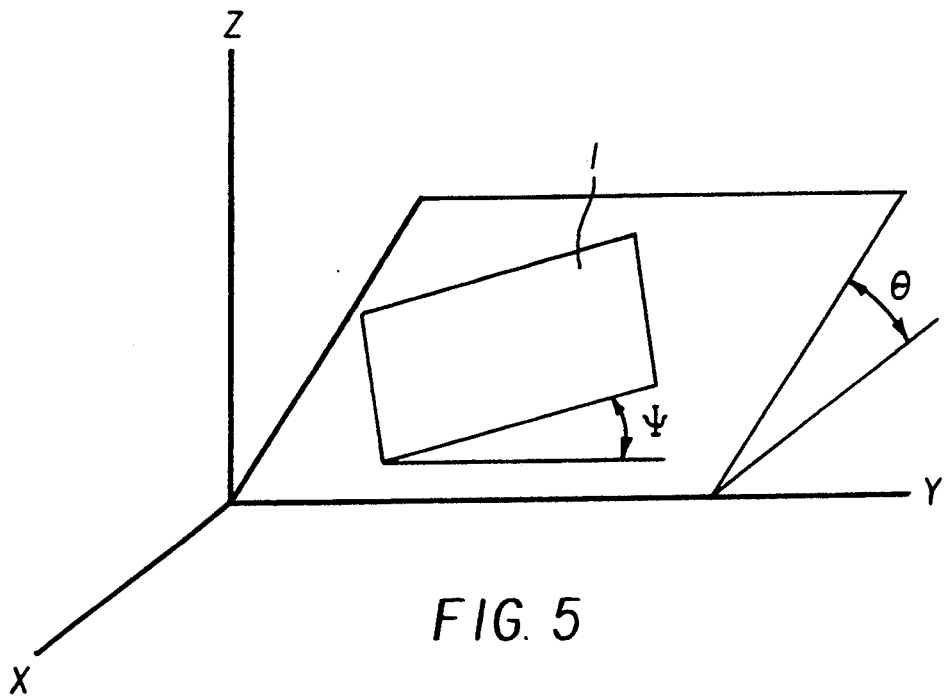
FIG. 5 shows the angles of cut of a second form of resonator in accordance with the invention.
Figure 6:
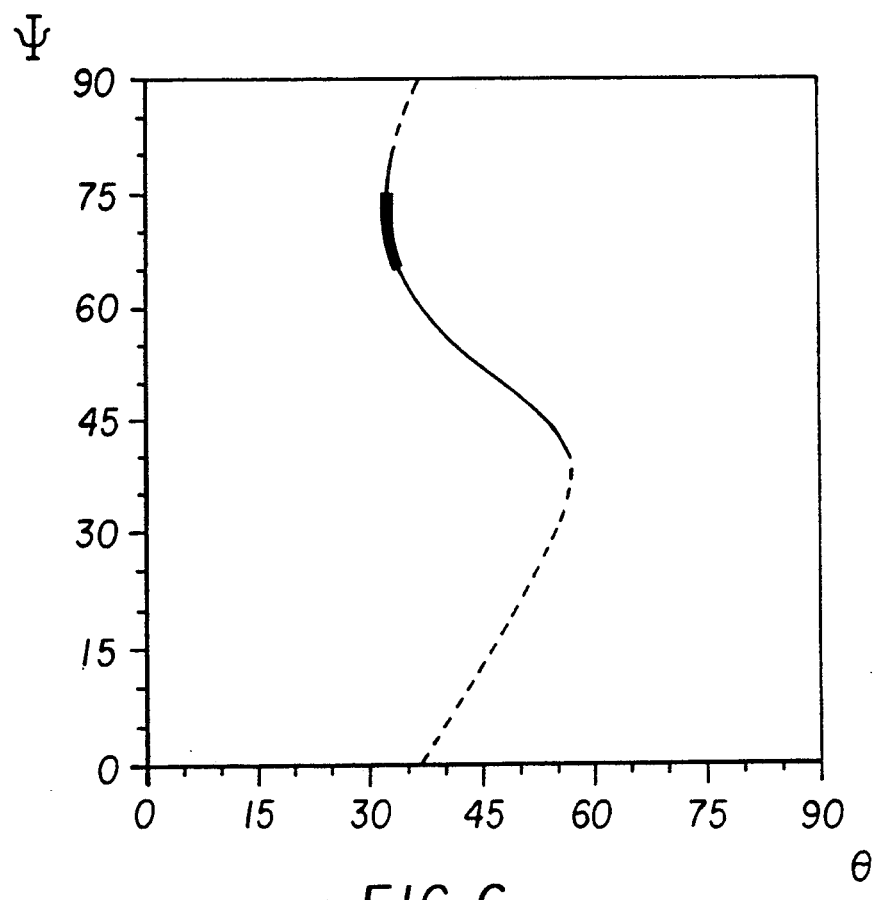
FIG. 6 shows the loci corresponding to zero values or the first order frequency-temperature coefficient, for the embodiment of FIG. 5.

FIG. 5 shows the angles of cut of a second embodiment of a resonator in accordance with the invention. The resonator is obtained by cutting one edge thereof (parallel the longitudinal axis of symmetry) at an angle $\theta$ with respect to the Y axis, followed by the major surfaces thereof being cut an angle $\psi$ with respect to the normal. The graph of FIG. 6 shows the possible values of the angles of cut $\theta$ and $\psi$ for which the coefficient of first order $\alpha$ is zero, in the same way as in FIG. 4.

It should be noted that the rotation of the substrate about its normal, likewise the angular orientation of the resonator, are much more difficult to control than the rotation of the substrate itself, (rotation about the X axis in FIG. 3 or the Y axis in FIG. 5). It follows that, to be of practical use, a cut should satisfy the two following conditions:

1) it should be located in a region where the coefficient of second order $\beta$ is small;
2) the tangent to the locus $\alpha=0$ should be close to vertical (infinite value).

The three following cuts allow conditions 1 and 2 to be met. They are:

For resonators of the first embodiment,
1) $\theta = -33°$; $\psi = 0$
2) $\theta = +34°$; $\psi = +45°$ For resonators of the first embodiment,
1) $\theta = 33°$ to $35°$; $\psi = 65°$ to $75°$ Furthermore, if the resonators are made by means of a chemical etching method, for example by using hydrofluoric acid or ammonium bifluoride, the following approximate limits have been to be taken into account, beyond which the quality of the cut provided chemically is no longer acceptable; $-30° < \theta < +65°$ for a rotation about the X axis and $|\theta| < 55°$. This means that, in the case of manufacture by chemical etching, only the cuts 2) and 3) are suitable. It should also be noted that the frequency-temperature coefficients depend, albeit weakly, on the following factors:

ratio of dimensions and relative thickness of the resonator;
dimensions of the fixing arm and of the frame;
geometry, thickness and material of the metallized regions needed to effect piezoelectric coupling and adjustment of the frequency of the resonator;
secondary elastic constants which depend themselves on the selected crystallographic orientation and can slightly alter the overall movement of the resonator.

The angles of cut to enable the coefficients $\alpha$ and $\beta$ to be zeroed and in particular the angles of cut 1), 2) and 3) above might as a result depart in some degree from the values given in FIGS. 4 and 6.

Figure 7A:
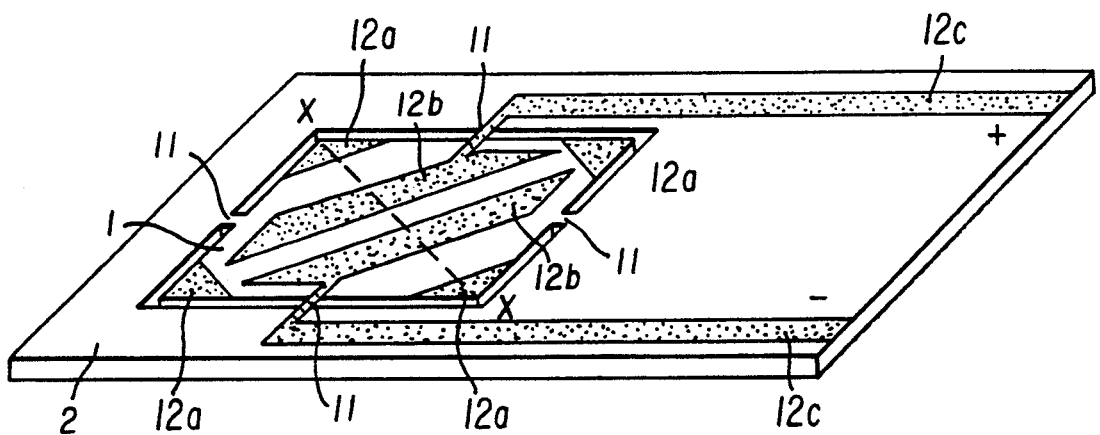
FIG. 7a shows an example of a resonator provided with electrodes.

FIG. 7 shows a preferred embodiment of the invention. The resonator 1 (FIG. 7a) is fixed to a frame 2 by four arms 11; this ensures the best resistance to possible shocks. The frame can be fixed by soldering or bonding on a cylindrical base (not shown) provided with insulated electrical connections. The assembly of the resonator and cylindrical base is then sealed under vacuum by a cylindrical metal cap fitted in a sealed manner to the base. Two distinct systems of metallization are shown in FIG. 7a.

Figure 7B:
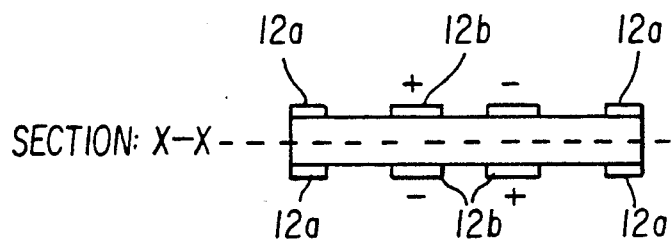

The first system comprises metallized zones 12a which are located on the two faces of the resonator and in each of the corners of the rectangular plate, and are not connected to the outside. The purpose of this first system of metallization is to allow adjustment of the frequency of the resonator after manufacture, through selective vaporization of metal with the aid of a laser beam. This operation which is necessary because of manufacturing tolerances, allows the design frequency to be achieved. A coarse adjustment can be effected directly on the substrate and the final adjustment when the resonator is mounted on its base. The second system of metallization comprises a set of two-pole electrodes 12b on each face, which enable piezoelectric coupling which is necessary for excitation of the torsional mode of vibration. The electrodes 12b are formed in the central part of the resonator and are aligned on a straight line whose inclination depends on the selected crystallographic cut. The section of FIG. 7b shows the reversal of polarity of the electrodes 12b on the two faces of the resonator. The electrodes 12b are connected to electric conductors on the supporting base through metallic tracks 12c on the external frame and the region of bonding/soldering.

In one particular embodiment, the characteristics of a resonator such as is represented in FIG. 7 are as follows:

| frequency | 524 KHZ |
|---|---|
| cut | $\theta = +34°$; $= +45°$ |
| inclination of electrodes | 45° |
| thickness | 80 μm |
| square plate | 0.75 mm × 0.75 mm |
| overall dimensions | 1.2 mm × 2.3 mm. |

Figure 8:
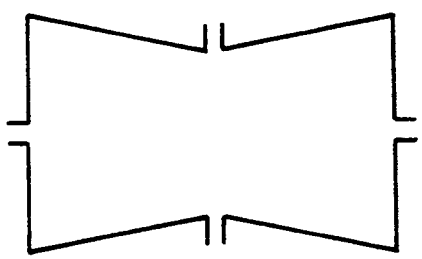
FIG. 8 shows another embodiment of a resonator in accordance with the invention.
Figure 9:
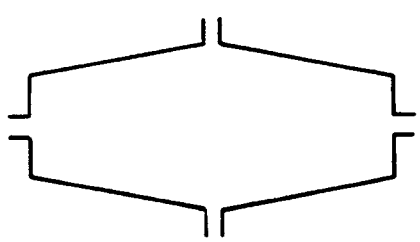
FIG. 9 shows another embodiment of a resonator in accordance with the invention.

Various modifications, corresponding to changes of greater or lesser significance in the described examples can be envisaged. The simple square or rectangular geometry, such as that shown, is not the only geometry which allows implementation of the torsional mode characteristic of the invention. In particular modified square or rectangular shapes, such as are shown in FIGS. 8 and 9, can be considered, or parallelograms, circles or ellipses (not shown). Such modifications can significantly alter the thermal properties, especially the frequency-temperature coefficient of second order. These modifications can likewise, depending on the particular case, imply an alteration in the angles of crystallographic cut of some degrees. In a similar manner the coupling electrodes can be changed and can, for example, incorporate non-straight parts. The shape of the electrodes depends on the shape chosen for the resonator. The various embodiments of the resonator shown each have two pairs of opposed arms connecting resonator and frame. However, as mentioned above, it is possible to dispense with one of the two pairs to reduce the perturbing effect of the external frame on the central resonator. In this case a smaller resistance to shocks results. Moreover, notches can be provided between the frame and the actual mounting region in order to increase the Q factor and to reduce the influence of the mounting on the base of the resonator.

Although the invention has been described with reference to specific embodiments, it is obvious that it can be subject to modification and variants without departing from its scope.

What is claimed is:

1. A quartz resonator comprising:
a thin quartz plate having opposite major surfaces, each of said opposite major surfaces having a geometrical shape symmetrical or antisymmetrical with respect to an axis of reference; and
X, Y and Z crystallographic directions corresponding to electrical, mechanical and optical axes, respectively, of said quartz plate, wherein said axis of reference forms an angle $\psi$ with said X axis, and said major surfaces form an angle $\theta$ with a plane defined by said X and Y axes, said angles $\theta$ and $\psi$ being about $+34°$ and $+45°$, respectively, such that the first order frequency-temperature coefficient ($\alpha$) of the quartz resonator is substantially 0, and the second order frequency-temperature coefficient ($\beta$) of said quartz resonator is substantially 0.

2. The resonator of claim 1, further comprising a supporting base, said thin plate being fixed to said supporting base by at least one pair of connecting arms connected to said thin plate at positions along nodal lines of said thin plate.

3. The resonator of claim 1, wherein said thin plate is rectangular.

4. The resonator of claim 1, wherein said thin plate is square.

5. The resonator of claim 1, wherein said thin plate is parallelogram.

6. The resonator of claim 1, wherein said thin plate is elliptical.

7. The resonator of claim 1, wherein said thin plate is circular.

8. A quartz resonator comprising:
   a thin quartz plate having opposite major surfaces, each of said opposite major surfaces having a geometrical shape symmetrical or antisymmetrical with respect to an axis of reference; and
   X, Y and Z crystallographic directions corresponding to electrical, mechanical and optical axis, respectively, of said quartz plate, wherein said axis of reference forms an angle $\psi$ with respect to said Y axis, and said major surfaces form an angle $\theta$ with a plane defined by said X and Y axes, said angles $\theta$ and $\psi$ being between $+33°$ and $+35°$, respectively, such that the first order frequency-temperature coefficient ($\alpha$) of the quartz resonator is substantially 0, and the second order frequency-temperature coefficient ($\beta$) of said quartz resonator is substantially 0.

9. The resonator of claim 8, further comprising a supporting base, said thin plate being fixed to said supporting base by at least one pair of connecting arms connected to said thin plate at positions along nodal lines of said thin plate.

10. The resonator of claim 8, wherein said thin plate is rectangular.

11. The resonator of claim 8, wherein said thin plate is square.

12. The resonator of claim 8, wherein said thin plate is parallelogram.

13. The resonator of claim 8, wherein said thin plate is elliptical.

14. The resonator of claim 8, wherein said thin plate is circular.

* * * * *